US012800425B2

(12) United States Patent
Cheng et al.

(10) Patent No.: US 12,800,425 B2
(45) Date of Patent: Nov. 17, 2026

(54) SPLIT CHANNEL GAS SHOWERHEAD TEST FIXTURE

(71) Applicant: Applied Materials, Inc., Santa Clara, CA (US)

(72) Inventors: Frank Wing-Fung Cheng, Santa Clara, CA (US); Dien-Yeh Wu, Santa Clara, CA (US); Yuji Murayama, Santa Clara, CA (US); Sam Kim, Santa Clara, CA (US); Scott Lin, Hsinchu East District (TW); Ai Ching Chang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 172 days.

(21) Appl. No.: 18/899,854

(22) Filed: Sep. 27, 2024

(65) Prior Publication Data

US 2026/0036485 A1 Feb. 5, 2026

Related U.S. Application Data

(60) Provisional application No. 63/678,829, filed on Aug. 2, 2024.

(51) Int. Cl.
*G01M 3/26* (2006.01)
*C23C 16/455* (2006.01)

(52) U.S. Cl.
CPC ......... *G01M 3/26* (2013.01); *C23C 16/45565* (2013.01)

(58) Field of Classification Search
CPC .... G01M 3/26; G01M 3/2815; G01M 3/2853; C23C 16/45565; C23C 16/45544
See application file for complete search history.

(56) References Cited

U.S. PATENT DOCUMENTS

| | | | | |
|---|---|---|---|---|
| 3,949,596 | A | 4/1976 | Hawk | |
| 4,584,877 | A | 4/1986 | Brayman | |
| 5,375,458 | A | 12/1994 | Oliver et al. | |
| 2013/0074584 | A1 | 3/2013 | Graham | |
| 2014/0216451 | A1 | 8/2014 | Jaffe et al. | |
| 2022/0056584 | A1 * | 2/2022 | Agarwal | C23C 16/45544 |
| 2022/0084855 | A1 | 3/2022 | Kim | |

(Continued)

FOREIGN PATENT DOCUMENTS

| | | | |
|---|---|---|---|
| CN | 215811443 | U | 2/2022 |
| JP | 2020105616 | A | 7/2020 |

(Continued)

OTHER PUBLICATIONS

PCT International Search Report and Written Opinion in PCT/US2025/038799 dated Nov. 13, 2025, 9 pages.

*Primary Examiner* — Thomas M Hammond, III
(74) *Attorney, Agent, or Firm* — Servilla Whitney LLC

(57) ABSTRACT

Provided are showerhead assembly test fixtures and methods for testing leakage between multi-channel showerhead channels. The leak test fixture comprises a fixture base with a plurality of compression elements, a seal plate with a plurality of protrusions, a gasket on the seal plate, and a clamp configured to secure the showerhead assembly so that the front surface of the faceplate is in contact with the gasket and the plurality of protrusions on the seal plate block the openings in the front surface of the faceplate.

20 Claims, 12 Drawing Sheets

(56) References Cited

U.S. PATENT DOCUMENTS

| | | | | |
|---|---|---|---|---|
| 2024/0027300 | A1 | 1/2024 | Dewailly | |
| 2024/0198366 | A1 * | 6/2024 | Nandwana | B05B 1/005 |

FOREIGN PATENT DOCUMENTS

| | | | | |
|---|---|---|---|---|
| KR | 20210019200 | A | 2/2021 | |
| WO | WO-2020023283 | A1 * | 1/2020 | C23C 16/45565 |
| WO | 2023004865 | A1 | 2/2023 | |

* cited by examiner

SPLIT CHANNEL GAS SHOWERHEAD TEST FIXTURE

CROSS-REFERENCE TO RELATED APPLICATIONS

This application claims priority to U.S. Provisional Application No. 63/678,829, filed Aug. 2, 2024, the entire disclosure of which is hereby incorporated by reference herein.

TECHNICAL FIELD

Embodiments of the disclosure generally relate to an apparatus and methods for flowing a gas into a processing chamber. More specifically, embodiments of the disclosure are directed apparatus and methods to leak test multi-channel showerheads.

BACKGROUND

During an atomic layer deposition (ALD) process, reactant gases are introduced separately into a process chamber containing a substrate. Generally, a region of a substrate is contacted with a first reactant which is adsorbed onto the substrate surface. The substrate is then contacted with a second reactant which reacts with the first reactant to form a deposited material. A purge gas may be introduced between the deliveries of each reactant gas to ensure that the only reactions that occur are on the substrate surface.

A multi-channel showerhead can be used to separately introduce the reactants to prevent gas phase reactions. Leakage between channels during operation of a multi-channel gas showerhead can lead to process non-uniformity and particle issues in an atomic layer deposition application, resulting in loss of wafer yield. Unintended leakage between channels due to the quality of the sealing between channels can cause process and particle issues.

Verification of the seal integrity after assembly of the showerhead is difficult. The channels join the same volume on the side of the showerhead opposite the channels. Accordingly, there is a need in the art for apparatus and methods to test the seal integrity of multi-channel showerheads.

SUMMARY

One or more embodiments of the disclosure are directed to a showerhead assembly leak test fixture including: a fixture base having a top surface; a plurality of compression elements extending from the top surface of the fixture base; a seal plate having a top surface and a bottom surface with a plurality of protrusions extending from the top surface; a gasket having a top surface and a bottom surface, the bottom surface in contact with the plurality of protrusions extending from the seal plate; and a clamp configured to secure the showerhead assembly so that a front surface of a faceplate of the showerhead assembly contacts the gasket and the plurality of protrusions on the seal plate to block openings in the front surface of the faceplate.

Additional embodiments are directed to a method of testing a multi-channel showerhead assembly for leaks, the method including: sealing a plurality of openings in a front surface of a faceplate of the showerhead assembly using a showerhead assembly leak test fixture, each of the plurality of openings in fluid communication with one channel of the showerhead assembly, the showerhead assembly leak test fixture including a fixture base with a plurality of compression elements extending from a top surface thereof, a seal plate on the compression elements, the seal plate having a plurality of protrusions extending from a top surface thereof, and a gasket positioned on a top surface of the plurality of protrusions, the front surface of the faceplate of the showerhead assembly in contact with the gasket; pressurizing one of the channels in the showerhead assembly; and measuring gas leaking through another of the channels in the showerhead assembly.

BRIEF DESCRIPTION OF THE DRAWINGS

So that the manner in which the above recited features of the disclosure are attained and can be understood in detail, a more particular description of the disclosure, briefly summarized above, may be had by reference to the embodiments thereof which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
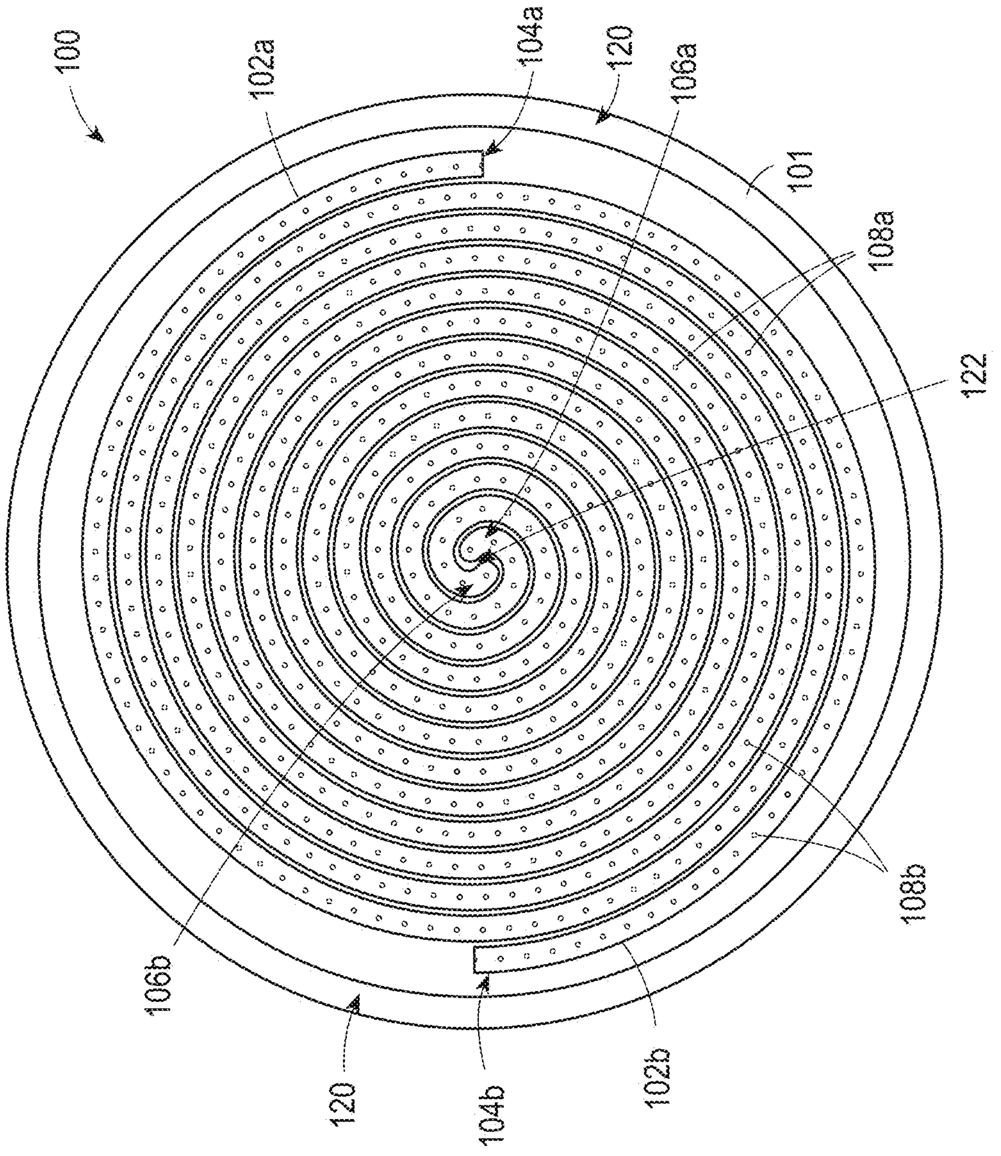
FIG. 1 shows a top view of a showerhead assembly in accordance with one or more embodiments of the disclosure.

Embodiments of the disclosure are directed to showerhead assembly for use in chemical vapor deposition type processes. One or more embodiments of the disclosure are directed to atomic layer deposition processes and apparatus (also called cyclical deposition) incorporating the showerhead assembly described. The showerhead assembly described may be referred to as a showerhead or gas distribution plate, but it will be recognized by those skilled in the art that the apparatus does not need to be shaped like a showerhead or plate. The terms "showerhead" and "plate" should not be taken as limiting the scope of the disclosure.

The disclosure provides an apparatus and a method for testing the seal integrity between channels of a split channel gas showerhead using an assembly to seal the face and flow or pressure sensors to check for leakage flow. The assembly comprises of a gasket, a plate with a pattern of raised features to apply localized pressure around the holes on the face of the showerhead, and a support comprising springs to apply forces conformally.

One or more embodiments include the use of a sealing plate assembly comprising a patterned plate and spring array to seal the showerhead holes, in conjunction with measuring flow or rate-of-rise to measure leakage.

With the disclosure, sealing of the showerhead holes is improved, which results in more sensitivity to the leakage between the split channels that is intended to be measured. This allows for better quality assurance of new and recycled showerhead assemblies, preventing wafer yield loss.

FIGS. 1 through 5 illustrate a dual channel showerhead for use with one or more embodiments of the disclosure. A showerhead assembly 100 comprises a faceplate 103 with two gas delivery channels 102*a*, 102*b* recessed in the back surface 101 of the faceplate 103. The first gas delivery channel 102*a* has a first inlet end 104*a* and a first outlet end 106*a* and a plurality of first apertures 108*a* spaced along the length of the first gas delivery channel 102*a*. The second gas delivery channel 102*b* has a second inlet end 104*b*, a second outlet end 106*b* and a plurality of second apertures 108*b* spaced along the length of the second gas delivery channel 102*b*.

A first inlet 110*a* is connected to the first inlet end 104*a* of the first gas delivery channel 102*a*. The first inlet 110*a* is adapted to be connected to a gas source. A first outlet 112*a* is connected to the first outlet end 106*a* of the first gas delivery channel 102*a*. The first outlet 112*a* is adapted to be connected to a vacuum source. A second inlet 110*b* is connected to the second inlet end 104*b* of the second gas delivery channel 102*b*. The second inlet 110*b* is adapted to be connected to a gas source. A second outlet 112*b* is connected to the second outlet end 106*b* of the second gas delivery channel 102*b*. The second outlet 112*a* is adapted to be connected to a vacuum source.

In the embodiment shown in FIGS. 1 to 5, each of the gas delivery channels 102*a*, 102*b* form a spiral shape. One or more embodiments, as shown in the Figures, have the two gas delivery channels 102*a*, 102*b* intertwined along the length of the spiral shape. It will be understood by those skilled in the art that the two gas delivery channels 102*a*, 102*b* can have shapes other than spiral and do not need to intertwine. In certain embodiments, the plurality of first apertures 108*a* and second apertures 108*b* extend through the faceplate 103 to the front surface 105 of the faceplate 103.

In some embodiments, each of the gas delivery channels 102*a*, 102*b* form a spiral shape with one of the inlet end 104*a*, 104*b* and outlet end 106*a*, 106*b* positioned in an outer peripheral region 120 of the faceplate 103 and the other of the inlet end 104*a*, 104*b* and outlet end 106*a*, 106*b* positioned in a central region 122 of the faceplate 103. In one or more embodiments, the inlet ends 104*a*, 104*b* of both gas delivery channels 102*a*, 102*b* is positioned in the outer peripheral region 120 and the inlet ends 104*a*, 104*b* of both gas delivery channels 102*a*, 102*b* are positioned in the central region 122 of the faceplate 103. In certain embodiments, the inlet ends 104*a*, 104*b* of both gas delivery channels 102*a*, 102*b* is positioned in the central region 122 and the inlet ends 104*a*, 104*b* of both gas delivery channels 102*a*, 102*b* are positioned in the outer peripheral region 120 of the faceplate 103. In one or more embodiments, one or the inlet ends 104*a*, 104*b* is positioned in the outer peripheral region 120 and the other inlet end 104*b*, 104*a* is positioned at the central region 122, with the outlet ends 106*a*, 106*b* at the other end of each individual gas delivery channel 102*a*, 102*b*.

Figure 2:
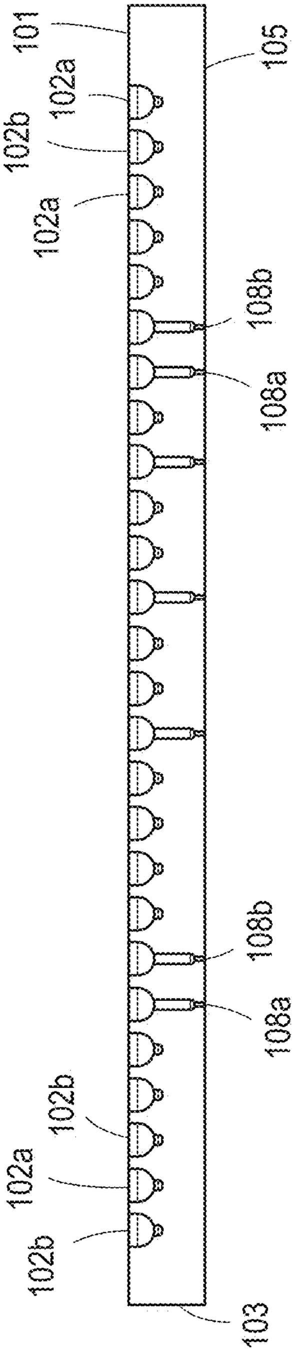
FIG. 2 shows a cross-sectional view of a showerhead assembly in accordance with one or more embodiments of the disclosure.
Figure 3:
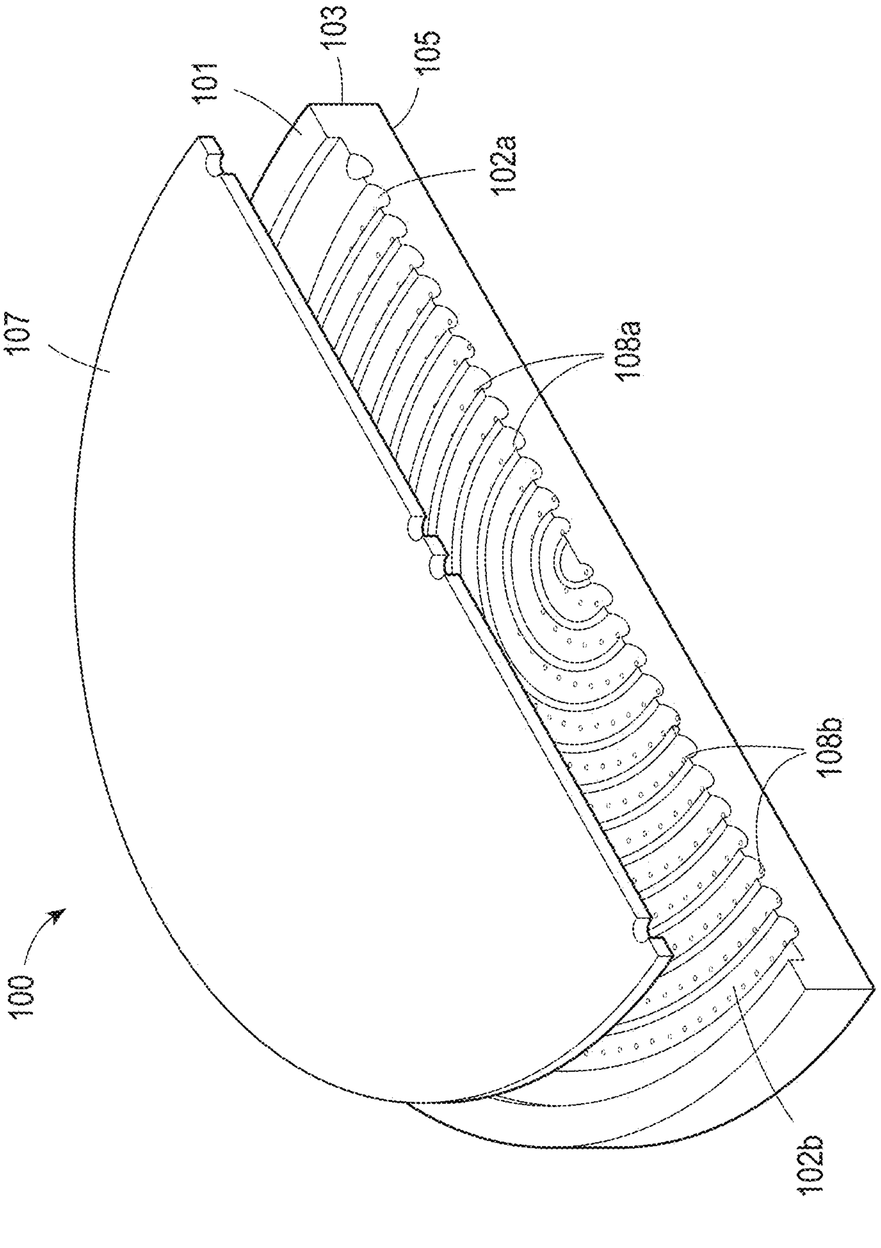
FIG. 3 shows an exploded cross-sectional isometric view of a showerhead assembly in accordance with one or more embodiments of the disclosure.

FIG. 3 shows a backing plate 107 for the faceplate 103 shown in FIG. 2. There are four holes (not numbered) located in the backing plate 107 which align approximately with the inlet ends 104*a*, 104*b* and outlet ends 106*a*, 106*b* of the gas delivery channels 102*a*, 102*b*. The holes can be used to provide an access point for connecting into the inlet 110*a*, 110*b* and outlet 112*a*, 112*b* to the gas delivery channels 102*a*, 102*b*. In some embodiments, inlet 110*a*, 110*b* and outlet 112*a*, 112*b* are integrally formed with the backing plate 107. Additionally, as seen in FIGS. 4 and 5, there can be one or more inlet valves 114*a*, 114*b* and one or more outlet valves 116*a*, 116*b*.

Figure 4:
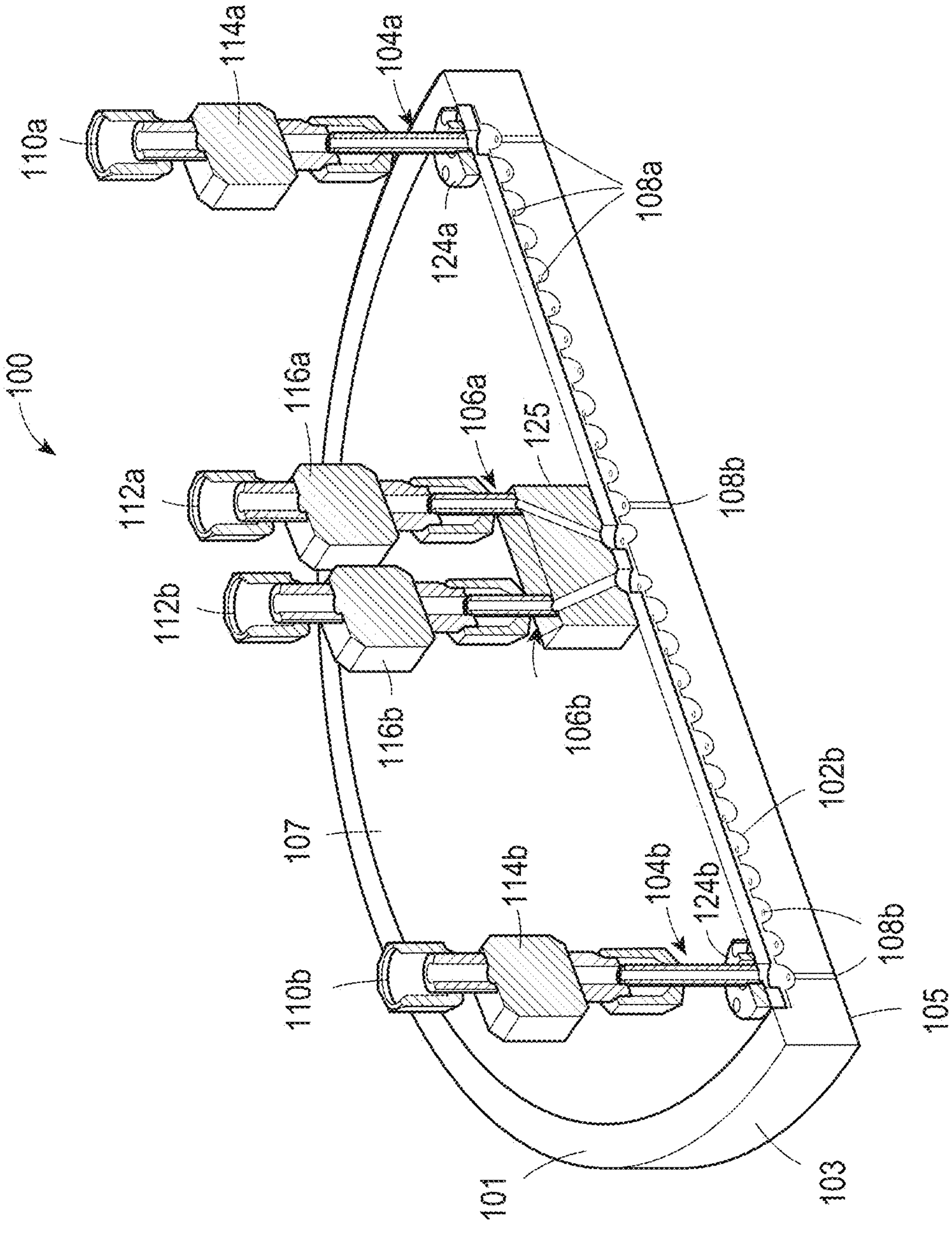
FIG. 4 shows a cross-sectional isometric view of a showerhead assembly in accordance with one or more embodiments of the disclosure.
Figure 5:
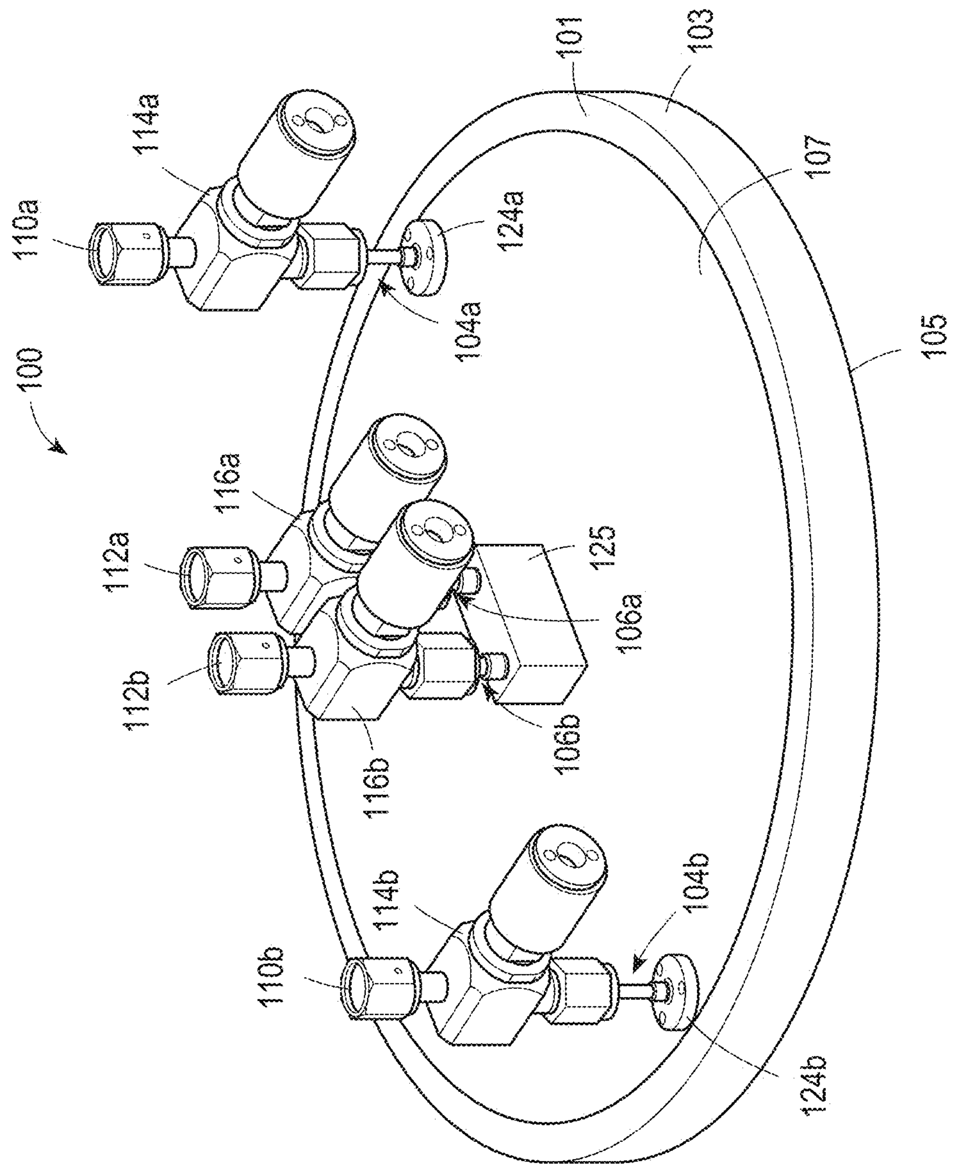
FIG. 5 shows an isometric view of a showerhead assembly in accordance with one or more embodiments.

FIGS. 4 and 5 show isometric views of a showerhead assembly 100 in accordance with various embodiments of the disclosure. The inlets 110*a*, 110*b* are shown connected to the backing plate 107 with a flange 124*a*, 124*b*. The connection and gas-tight sealing of the flange 124*a*, 124*b* can be accomplished by any suitable mechanism and techniques as known to those skilled in the art. The outlets 112*a*, 112*b* can also be connected to the backing plate 107 with a flange or with a connection block 125. The connection block 125 can be integrally formed with the backing plate 107 or can be a separate piece. The connection block 125 may provide additional support and space for the outlet valves 116*a*, 116*b*, allowing the connecting tubes to protrude from the backing plate 107 at an angle. Although the inlets 110*a*, 110*b* and inlet valves 114*a*, 114*b* are shown on the outer peripheral region 120 of the faceplate 103 and the outlets 112*a*, 112*b* and outlet valves 116*a*, 116*b* are shown at the central region 122 of the faceplate 103, it will be understood that these components can be reversed or intermixed and that the drawings are merely illustrative of one embodiment.

As the gas delivery channels spiral from the outer peripheral edge of the gas distribution plate to the central region, or vice versa, a seeming plurality of adjacent channels are observable in cross-section. With the spirals intertwined, the gas in every adjacent channel is from the other inlet 110*a*, 110*b*. The channels are separated by a distance from the adjacent channels.

The length of the gas channel shown in FIGS. 1 through 5 can vary depending on a number of factors, including, but not limited to, the diameter of the channel and the distance between the adjacent channels. The number of apertures is also dependent on a number of factors, including but not limited to, the length of the gas delivery channel and the spacing of the apertures.

Figure 6:
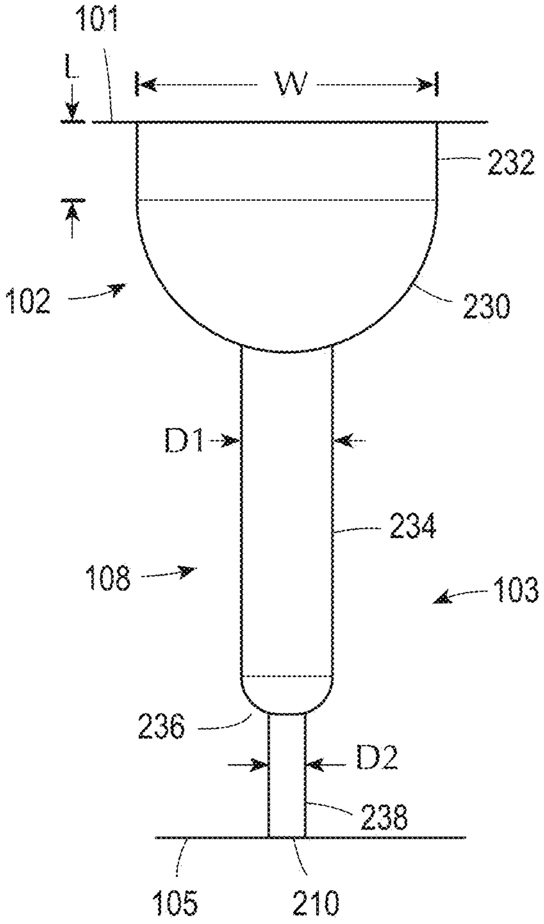
FIG. 6 shows a cross-sectional schematic view of a portion of a showerhead assembly in accordance with one or more embodiments of the disclosure.

FIG. 6 shows a cross-sectional view of one portion of a gas delivery channel 102 and an aperture 108 in a faceplate 103 in accordance with one or more embodiments of the disclosure. It will be understood by those skilled in the art that the gas delivery channel and apertures described in FIG. 5 are merely illustrative and should not be taken as limiting the scope of the disclosure. Those skilled in the art will understand that there are other ways of creating flow from the gas delivery channel 102 through the faceplate 103. The gas delivery channel 102 shown in FIG. 6 has two portions, an upper portion 232 and a lower portion 230. While these portions are shown as separate areas, it will be understood that there can be a seamless transition between the upper portion 232 and the rounded lower portion 230.

Additionally, it will be understood that the upper portion 232 is optional and does not need to be included in the gas delivery channel 102. When there is no upper portion 232, the lower portion 230 is the only portion. Thus, the gas delivery channel can have any suitable shape. In some embodiments, the shape of the gas delivery channel is such that there is substantially no interference with the flow of gases through the channel.

The upper portion 232 can have any suitable shape. In the embodiment shown in FIG. 6, the upper portion 232 has walls which extend normal to the surface of the back surface 101 of the faceplate 103. However, it will be understood that the upper portion 232 can have walls which are canted from square to the back surface 101. The canting can provide a larger opening at the back surface 101 of the faceplate 103, tapering to a smaller opening. Additionally, the canting can provide a smaller opening at the back surface 101, tapering to a larger opening. The length of the upper portion 232 can be modified as necessary.

In some embodiments, the upper portion has sides which are substantially perpendicular to the back surface 101 of the faceplate 103 and extend a length L below the surface of the back surface 101. As used in this specification and the appended claims, the term "substantially perpendicular to" means that walls of the upper portion have an angle relative to the back side of the gas distribution plate in the range of about 25 degrees to about 15 degrees.

The rounded lower portion 230 can have any suitable cross-section including, but not limited to, half-round and half-elliptical. The width of the rounded lower portion, also referred to as the diameter of the rounded lower portion, can be modified as necessary. The width of the upper portion can be modified as necessary. The diameter of the gas delivery channel, in general, can have an impact of the number of loops in the spiral. In some embodiments, as shown in FIG. 6, the width of the upper portion is about equal to the diameter of the lower portion.

The specific shape of the apertures 108 can vary depending on the desired flow of gases through the apertures. In the embodiment of FIG. 6, the aperture 108 has three distinct sections; a first section 234, a second section 236 and a third section 238. Again, the number of sections and the shape of the sections are merely illustrative of one embodiment and should not be taken as limiting the scope of the disclosure. The first section 234 extends from the rounded lower portion 230 of the gas delivery channel 102 toward the front surface 105 of the faceplate 103. The first section 234 has a first diameter D1. The second section 236 extends from the first section 234 toward the front surface 105 and has a diameter which tapers from the first diameter D1 to a second diameter D2, which is generally smaller than the first diameter. The third section 238 extends from the end of the second section 236 and ends at the front surface 105 of the faceplate 103. At the intersection of the third section 238 and the front surface 105, an opening 210 is formed. Gases flowing through the gas delivery channel 102 exit the faceplate 103 through this opening 210 into the processing chamber. The opening 210 has about the same diameter as the second diameter D2.

Figure 7:
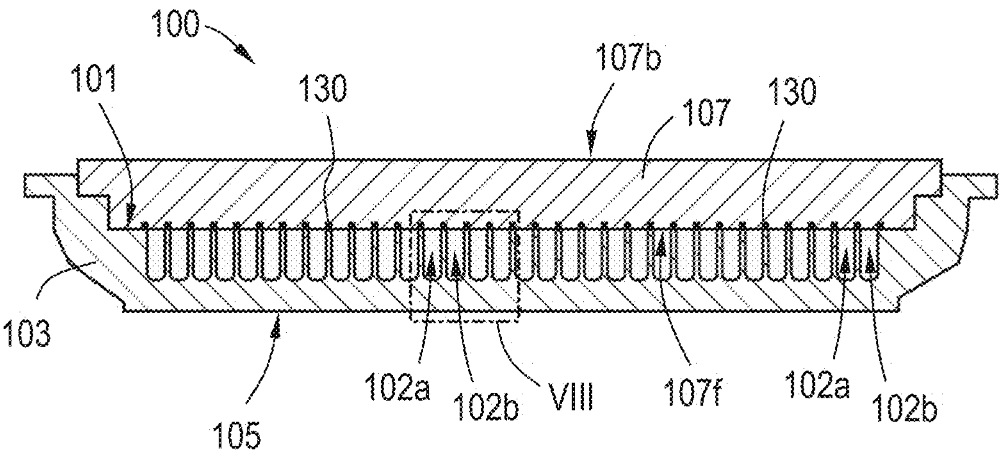
FIG. 7 shows a partial cross-sectional view of a showerhead assembly in accordance with one or more embodiments of the disclosure.
Figure 8:
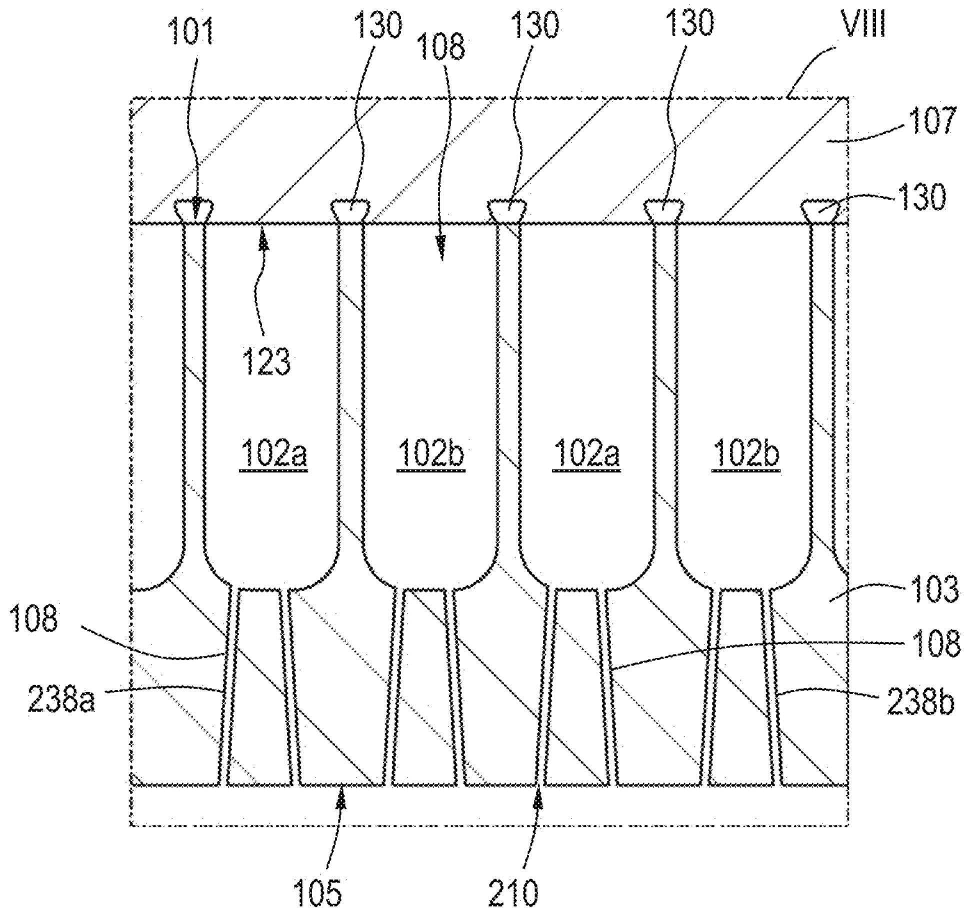
FIG. 8 shows a view of an expanded partial cross-sectional view of region VIII of FIG. 7.

The embodiment illustrated in FIG. 6 shows a third section 238 that ends at the front surface 105 of the faceplate 103 at an angle that is substantially perpendicular to the front surface 105. This orientation will result in an opening 210 that has a substantially round appearance. This is merely representative of one possible configuration and should not be taken as limiting the scope of the disclosure. In some embodiments, as illustrated in FIGS. 7 and 8, aperture 108 (also referenced as third section 238*a*, 238*b*) ends at the front surface 105 of the faceplate 103. The skilled artisan will recognize that the opening 210 formed in the front surface 105 of the faceplate 103 will have an oblong shape depending on the angle that the aperture 108 ends at the front surface 105.

FIG. 7 shows a cross-sectional view of another embodiment of a showerhead assembly 100. FIG. 8 shows an expanded view of region VIII of FIG. 7. In some embodiments, the backing plate 107 has a front surface 107*f* and a back surface 107*b*. The front surface 107*f* of the backing plate 107 contacts the faceplate 103 within a pocket formed in the back surface 101 of the faceplate 103. The backing plate 107 can directly contact the faceplate 103, or can be in contact with the faceplate 103 through an intermediate component (e.g., seal 130).

The showerhead assembly 100 illustrated in FIGS. 7 and 8 includes a seal 130 positioned between the front surface 123 of the backing plate 107 and the back surface 101 of the faceplate 103. The seal 130 of some embodiments comprises a flexible material that can be compressed upon assembly of the showerhead assembly 100. In some embodiments, the seal 130 comprises a non-porous material that is configured to provide a gas-tight seal between the adjacent gas delivery channel 102. Suitable materials for the seal 130 include, but are not limited to fluoroelastomeric polymers (e.g. FKM and FFKM), and silicone rubber materials.

In some embodiments, the assembled showerhead assembly 100 is subjected to leak testing to ensure that the seal 130 maintains gas-tight separation between the first gas delivery channel 102*a* and the second gas delivery channel 102*b*. The Figures show an embodiment with two gas delivery channels. This should not be taken as limiting the scope of the disclosure as there can be more than two gas delivery channels. The skilled artisan will readily understand how to use the disclosed apparatus and methods with showerhead assemblies with three, four or more separate gas delivery channels, or segments of gas delivery channels.

One or more embodiments of the disclosure are directed to a showerhead assembly leak test fixture 300 configured for testing showerhead assemblies and methods to check for leakage between the first gas delivery channel 102*a* and the second gas delivery channel 102*b*. The showerhead assembly leak test fixture 300 of some embodiments includes a test manifold 380 with valves 382, 384 installed onto the inlet side of the showerhead assembly with the ability to connect to or isolate each of the channels. Some embodiments of the disclosure prevent unintended leakage between gas channels from affecting the quality of a film deposited using the showerhead assembly.

One or more embodiments of the disclosure incorporate test manifolds with valves that can be installed onto the inlet side of a showerhead assembly 100 with the ability to connect or isolate each end of each gas delivery channel 102. The outlet face of the showerhead assembly in some embodiments is sealed against the showerhead assembly leak test fixture 300.

Figure 9:
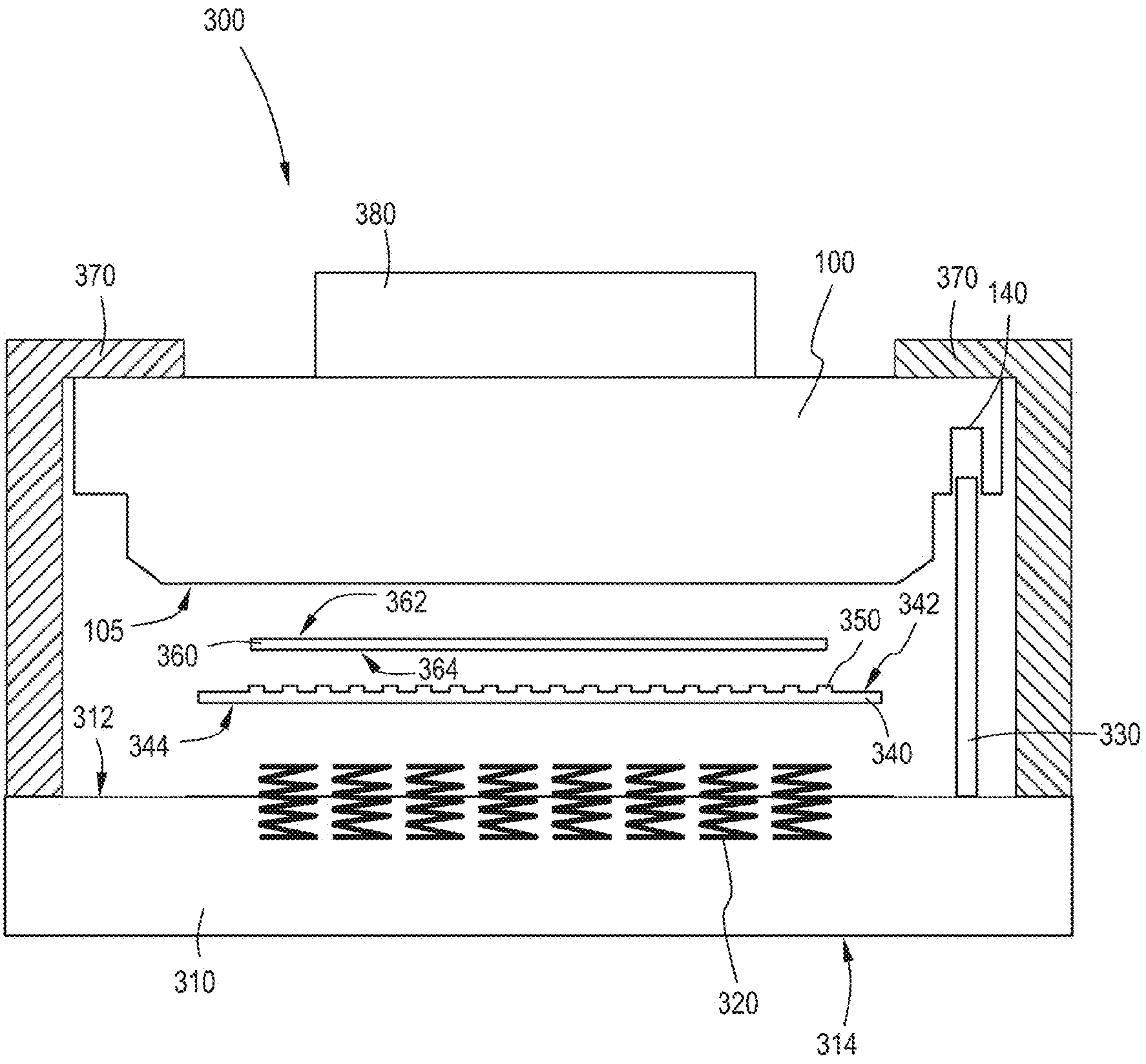
FIG. 9 shows a schematic view of a showerhead assembly in a leak test fixture in accordance with one or more embodiments of the disclosure.
Figure 10:
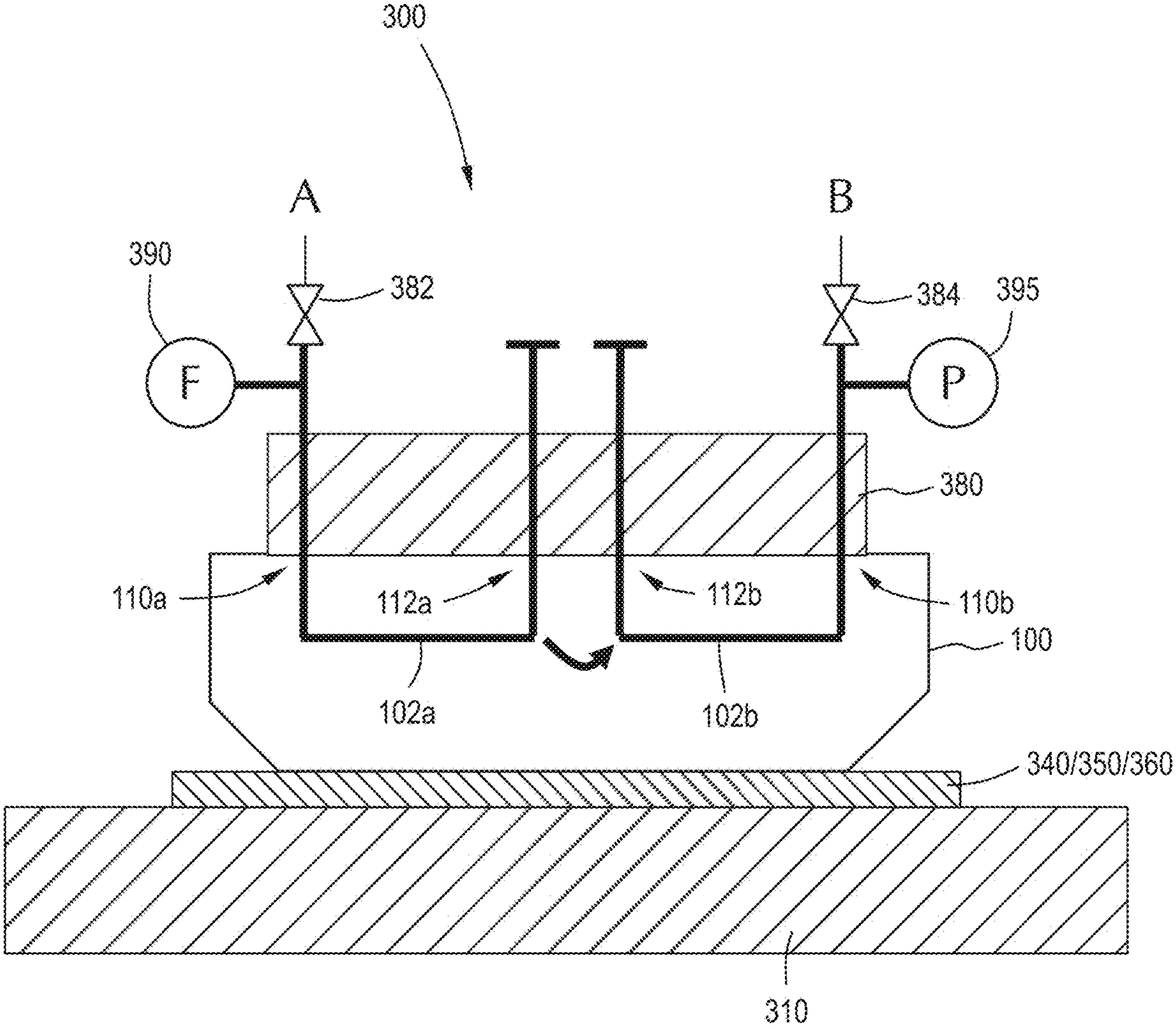
FIG. 10 shows a schematic view of a showerhead assembly in a leak test fixture in accordance with one or more embodiments of the disclosure.

FIG. 9 illustrates an exploded schematic representation of a showerhead assembly leak test fixture 300 according to one or more embodiments of the disclosure. FIG. 10 illustrates a schematic representation of the showerhead assembly leak test fixture 300 in use, according to one or more embodiments of the disclosure.

Accordingly, one or more embodiments of the disclosure are directed to showerhead assembly leak test fixture 300. The showerhead assembly leak test fixture 300 comprises a fixture base 310 having a top surface 312 and a bottom surface 314. The fixture base 310 can made of any suitably stiff material that does not deform under ordinary operating conditions.

Figure 11:
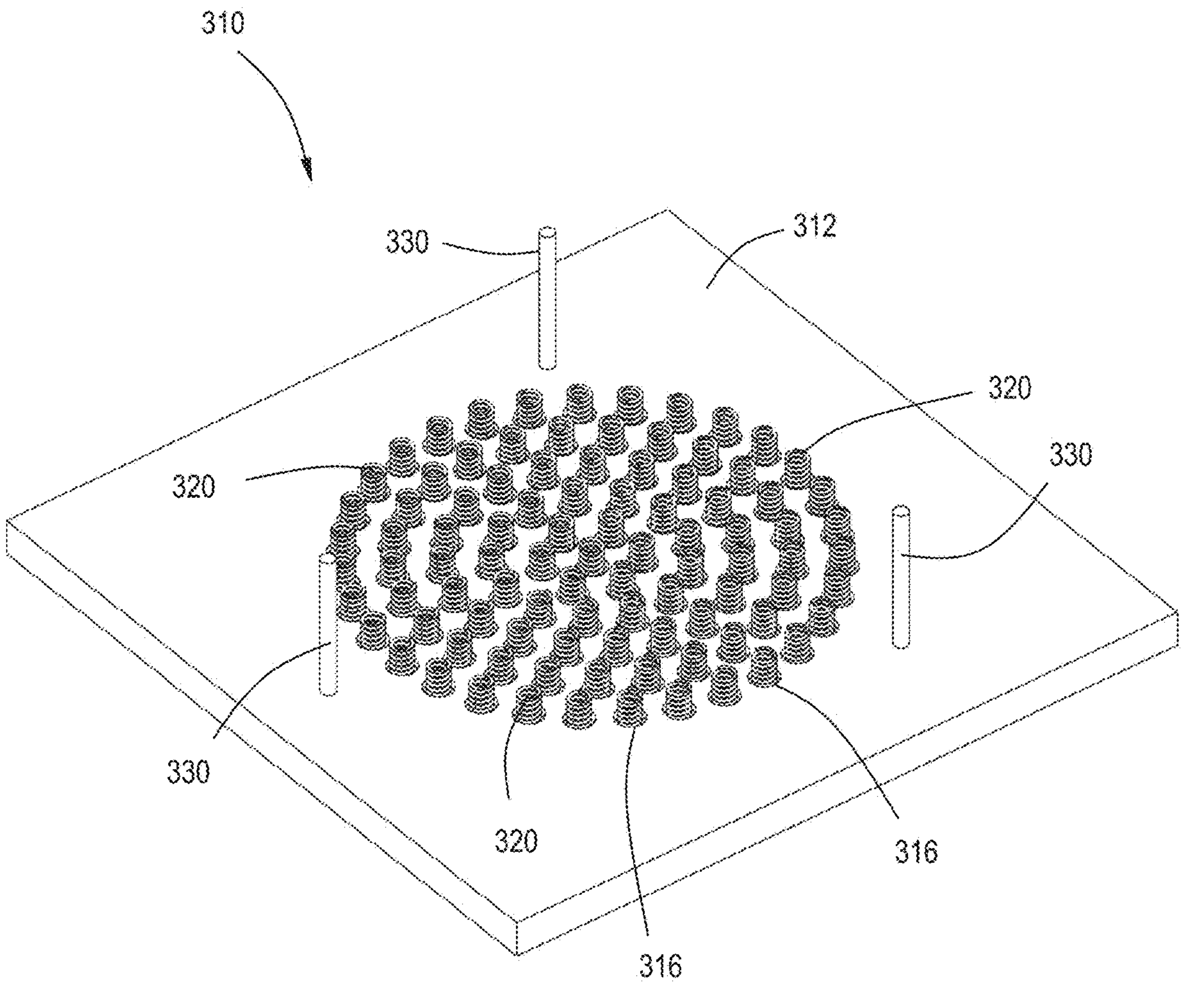
FIG. 11 illustrates a fixture base in accordance with one or more embodiments of the disclosure.

A plurality of compression elements 320 extend from the top surface 312 of the fixture base 310. FIG. 11 illustrates a fixture base 310 in accordance with one or more embodiments of the disclosure. The compression elements 320 can be any suitable material known to the skilled artisan that is capable of providing resistance to force directed toward the top surface 312. In some embodiments, the plurality of compression elements 320 comprise springs. In some embodiments, the plurality of compression elements 320 comprise a flexible material (e.g., memory foam).

The compression elements 320 can be connected to or affixed to the top surface 312 of the fixture base 310 by any suitable technique. The plurality of compression elements 320 can be permanently connected to the fixture base 310, or can be removable/replaceable. In some embodiments, as shown in FIG. 11, the plurality of compression elements 320 are positioned within openings 316 in the top surface 312 of the fixture base 310.

Some embodiments of the fixture base 310 incorporate a plurality of alignment pins 330 extending from the top surface 312. The plurality of alignment pins 330 can be positioned at any suitable locations around the top surface 312. In some embodiments, the plurality of alignment pins 330 extending from the top surface 312 of the fixture base 310 are configured to align with openings 140 in the showerhead assembly 100 to align the showerhead assembly 100 in a specific orientation for testing.

Referring again to FIG. 9, the showerhead assembly leak test fixture 300 includes a seal plate 340 having a top surface 342 and a bottom surface 344. The seal plate 340 includes a plurality of protrusions 350 that extend from (or above) the top surface 342. In use the bottom surface 344 of the seal plate 340 contacts the plurality of compression elements 320 of the fixture base 310.

The showerhead assembly leak test fixture 300 includes a gasket 360 having a top surface 362 and a bottom surface 364. In use, the bottom surface 364 of the gasket 360 is in contact with the plurality of protrusions 350 extending above the top surface 342 of the seal plate 340. The gasket can be made of any suitable material known to the skilled artisan. Suitable gasket materials include, but are not limited to, silicone, neoprene and EPDM rubbers.

A clamp 370 is configured to secure the showerhead assembly 100 so that the front surface 105 of the faceplate 103 contacts the top surface 362 of the gasket 360, and the plurality of protrusions 350 on the seal plate 340 block the openings 210 in the faceplate 103. Once sealed in this manner, in the testing configuration, the showerhead assembly 100 can be leak tested.

Figure 12A:
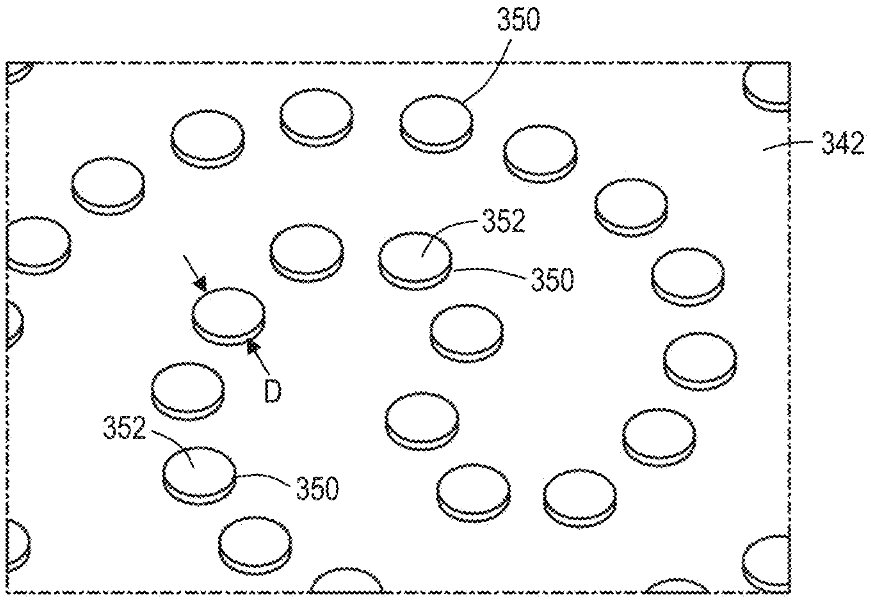
FIG. 12A illustrates a portion of the top surface of the seal plate according to one or more embodiments of the disclosure.
Figure 12B:
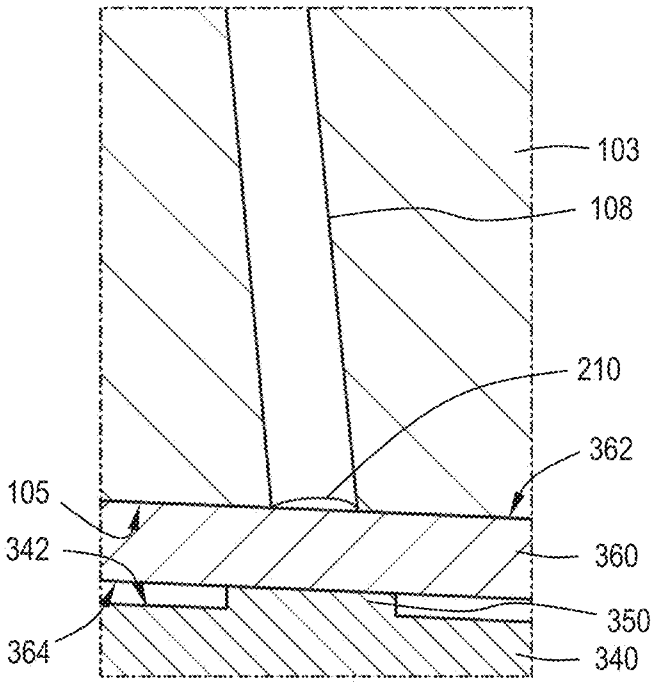
FIG. 12B illustrates a partial cross-sectional representation of a showerhead assembly in the testing configuration with the seal plate of FIG. 12A.

FIG. 12A illustrates a portion of the top surface 342 of the seal plate 340 according to one or more embodiments of the disclosure. FIG. 12B illustrates a cross-sectional representation of a showerhead assembly 100 in the testing configuration with the seal plate 340 of FIG. 12A. In use, the plurality of protrusions 350, with the gasket 360, seal the openings 210 in the front surface 105 of the faceplate 103.

In some embodiments, there are an equal number of plurality of protrusions 350 extending from, or above, the seal plate 340 as there are openings 210 in the front surface 105 of the faceplate 103. Stated differently, in some embodiments, each of the apertures 108 resulting in an opening 210 in the front surface 105 of the faceplate 103 is aligned with one of the plurality of protrusions 350 extending above the seal plate 340.

In some embodiments, the plurality of alignment pins 330 of the fixture base 310 are configured to align the faceplate 103 with the plurality of protrusions 350. In some embodiments, the seal plate 340 further comprises at least one opening that the plurality of alignment pins 330 of the fixture base 310 can pass through to ensure consistent alignment of the components for testing.

Referring to FIGS. 12A and 12B, in some embodiments, each of the plurality of protrusions 350 extends a height from the top surface 342 of the seal plate 340. In some embodiments, the height of the protrusions are greater than the amount of compression of the gasket. In the illustrated embodiment, the plurality of protrusions 350 are integrally formed with the seal plate 340 as a single component. In FIG. 12A, each of the plurality of protrusions 350 has a flat top surface 352 with a diameter D. In some embodiments, the diameter D of the flat top surface 352 of the plurality of protrusions 350 is greater than the diameter D2 of the aperture 108 that forms the opening 210 in the front surface 105 of the faceplate 103. In some embodiments, the diameter D of the plurality of protrusions 350 is greater than or equal to 50% larger than the diameter D2 of the opening 210. In use, the plurality of protrusions 350 push the gasket 360 against the front surface 105 of the faceplate 103 so that contact occurs around the openings 210, sealing the apertures 108.

Figure 13A:
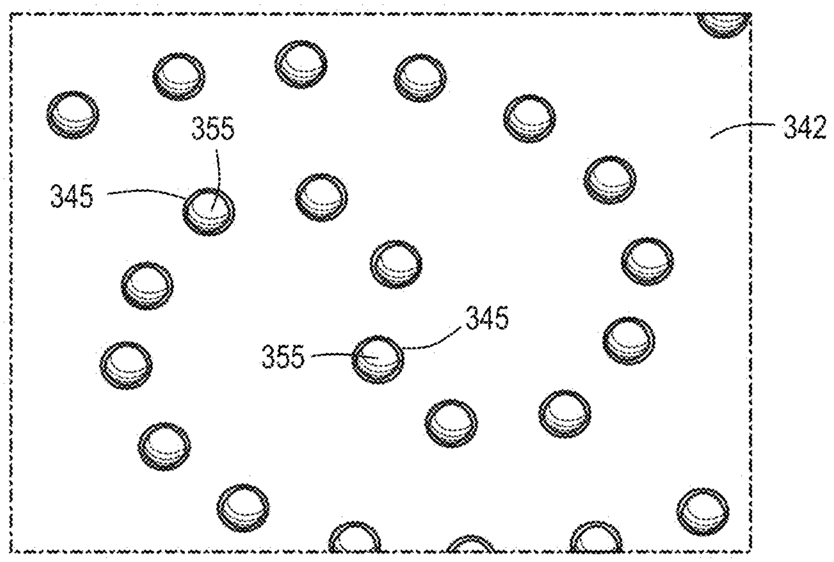
FIG. 13A illustrates a portion of the top surface of the seal plate according to one or more embodiments of the disclosure.
Figure 13B:
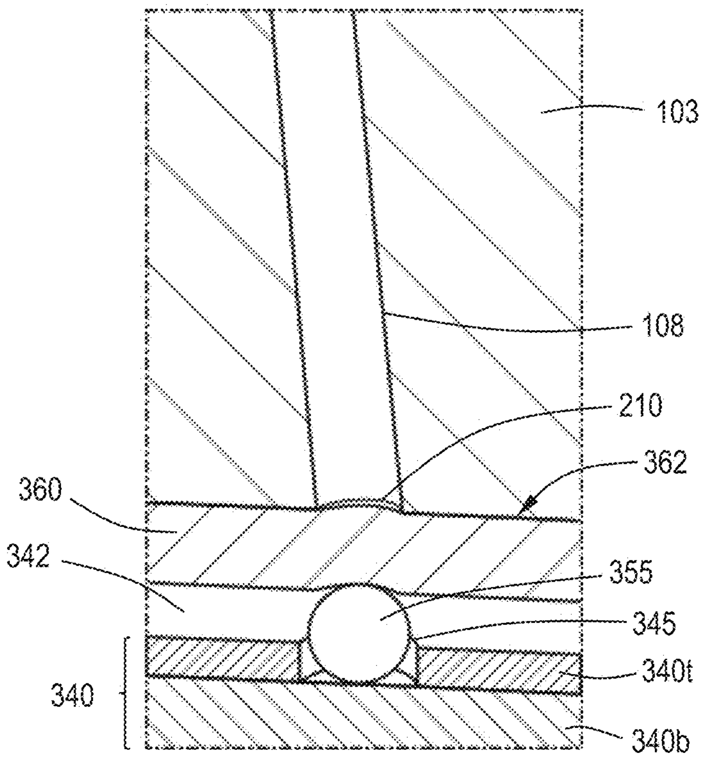
FIG. 13B illustrates a partial cross-sectional representation of a showerhead assembly in the testing configuration with the seal plate of FIG. 13A.

FIG. 13A illustrates a portion of the top surface 342 of the seal plate 340 according to one or more embodiments of the disclosure. FIG. 13B illustrates a cross-sectional representation of a showerhead assembly 100 in the testing configuration with the seal plate 340 of FIG. 13A.

In some embodiments, the top surface of the plurality of protrusions 350 is domed or pointed. Stated differently, the plurality of protrusions 350 of some embodiments comprise curved bodies. In use, the top portion of the plurality of protrusions 350 would push the gasket 360 slightly into the openings 210 in the front surface 105 of the faceplate 103.

In some embodiments, as shown in FIGS. 13A and 13B, the plurality of protrusions 350 comprise curved bodies 355 positioned within openings 345 in the seal plate 340 and extending above the top surface 342 of the seal plate 340. In the embodiment shown, the seal plate 340 comprises two pieces, a bottom seal plate 340*b* and a top seal plate 340*t*. The top seal plate 340*t* has a plurality of openings 345 aligned with the openings 210 of the faceplate 103, so that inclusion of curved bodies 355 in the openings 345 can align with the openings 210 of the faceplate 103.

In use, the plurality of protrusions 350, with the gasket 360, seal the openings 210 in the front surface 105 of the faceplate 103. In the embodiment of FIGS. 13A and 13B, when a force is directed on the showerhead assembly 100 in the direction of the fixture base 310, the curved bodies 355 that make up the plurality of protrusions 350 push a portion of the gasket 360 into each of the openings 210 in the faceplate 103.

Referring again to FIGS. 9 and 10, one or more embodiments of the disclosure are directed to methods of testing a multi-channel showerhead assembly 100 for leaks. The plurality of openings 210 in the front surface 105 of the faceplate 103 of the showerhead assembly 100 are sealed using the showerhead assembly leak test fixture 300. Each of the plurality of openings 210 are in fluid communication with one of the gas delivery channels 102 of the showerhead assembly 100, as described herein. The showerhead assembly leak test fixture 300 comprises a fixture base 310 with a plurality of compression elements 320 extending from a top surface 312 of the fixture base 310. A seal plate 340 having a plurality of protrusions 350 extending above the top surface 342 of the seal plate 340, and a gasket 360 are positioned on a top surface 342 of the seal plate to cover the top surface of the plurality of protrusions 350. In the embodiment shown in FIG. 10, the seal plate 340, plurality of protrusions 350 and gasket 360 are shown as a single item. The front surface 105 of the faceplate 103 of the showerhead assembly 100 is in contact with the gasket 360.

One of the gas delivery channels 102 is pressurized in the showerhead assembly 100. As used in this manner, the term "pressurized" means that the pressure in one channel is different from the pressure in another channel of the showerhead assembly 100. Pressurized can be either greater than atmospheric pressure, less than atmospheric pressure, or at atmospheric pressure with a different flow rate of gases within the channel. Once one channel is pressurized, gas leaking is measured, either through another of the channels in the showerhead assembly 100, or from the pressurized channel.

In some embodiments, sealing the plurality of openings 210 comprises securing the showerhead assembly 100 to the gasket 360, seal plate 340 and fixture base 310 with a clamp 370 directing force on the showerhead assembly 100 in the direction of the fixture base 310. In some embodiments, securing the showerhead assembly 100 to the gasket 360, seal plate 340 and fixture base 310 causes the plurality of protrusions 350 extending from the top surface 342 of the seal plate 340 to seal each of the openings 210 in the faceplate 103 of the showerhead assembly 100. In some embodiments, each of the protrusions has a flat top surface with a diameter greater than a diameter of the openings in the faceplate, as described with respect to FIGS. 12A and 12B. In some embodiments, each of the protrusions has a curved shape with a diameter smaller than a diameter of the openings in the faceplate, as described with respect for FIGS. 13A and 13B. In some embodiments, some of the plurality of protrusions 350 have a diameter greater than that of the openings 210 in the faceplate 103, and some of the plurality of protrusions 350 have curved bodies 355 smaller than the diameter of the openings 210 in the faceplate 103.

Some embodiments of the method further comprise the process of positioning the showerhead assembly 100 in the showerhead assembly leak test fixture 300 by aligning a plurality of alignment pins 330 extending from the top surface 312 of the fixture base 310 with corresponding openings 140 in the showerhead assembly 100. In some embodiments, the plurality of alignment pins 330 pass through openings in the seal plate 340 into the openings 140 in the showerhead assembly 100.

Some embodiments of the method comprise sealing a plurality of openings 210 in the front surface 105 of the faceplate 103 of the showerhead assembly 100 using any of the showerhead assembly leak test fixture 300 embodiments described herein. The method further comprises securing a test manifold 380 to the back surface 107*b* of the backing plate 107 of the showerhead assembly 100. The test manifold 380 isolates the first gas delivery channel 102*a* from the second gas delivery channel 102*b* in a dual channel showerhead assembly 100. The test manifold 380 is in fluid communication with the first inlet 110*a*, first outlet 112*a*, second inlet 110*b* and second outlet 112*b*. Valves 382, 384 are manipulated to pressurize one of the first gas delivery channels 102*a* relative to the second gas delivery channel 102*b*.

Once the test manifold 380 is secured to the showerhead assembly 100, one or more of the test configurations are performed. The test configurations can be performed manually by adjusting the control knobs of valve 382 and/or valve 384, or by a suitable controller configured to perform the one or more test configurations.

In a vacuum flow test configuration, a flow meter 390 is connected to the first gas delivery channel 102*a* which is exposed to atmosphere. A vacuum is connected to the second gas delivery channel 102*b*, and the flow rate in the first channel 102*a* is measured. In a static system, there would be no flow in the first gas delivery channel 102*a*. Flow measured in first gas delivery channel 102*a* indicates that there is a leak between the two gas delivery channels.

In a pressurized flow test configuration, a flow meter 390 is connected to the first gas delivery channel 102*a*, which is in fluid communication with a pressurized gas source (e.g., a gas cylinder). The second gas delivery channel 102*b* is exposed to atmosphere, and the flow rate in the first gas delivery channel 102*a* is measured. In a static system, there would be flow as a result of leakage. In a similar test configuration, with the flow meter on the second gas delivery channel 102*b*, a measured flow would indicate a leak.

In a vacuum rate-of-rise configuration, the first gas delivery channel 102*a* is exposed to atmosphere and second gas delivery channel 102*b* is isolated under vacuum. A pressure monitor 395 is connected to the second gas delivery channel 102*b*. The rate of rise in pressure in the second gas delivery channel 102*b* is measured. A rise in pressure in the second gas delivery channel 102*b* indicates a leak between the gas delivery channels. The rate of leakage measured can indicate the degree of leakage. In another configuration, positive pressure is applied in the first gas channel and the pressure decay in the second gas channel is monitored.

In some embodiments, the showerhead assembly leak test fixture 300 includes at least one controller (not shown). The controller has a processor, a memory coupled to the processor, input/output devices coupled to the processor, and support circuits to communication between the different electronic and mechanical components. The memory can include one or more of transitory memory (e.g., random access memory) and non-transitory memory (e.g., storage).

The memory, or computer-readable medium, of the processor may be one or more of readily available memory such as random access memory (RAM), read-only memory (ROM), floppy disk, hard disk, or any other form of digital storage, local or remote. The memory can retain an instruction set that is operable by the processor to control parameters and components of the system. The support circuits are coupled to the processor to support the processor in a conventional manner. Circuits may include, for example, cache, power supplies, clock circuits, input/output circuitry, subsystems, and the like.

Processes may generally be stored in the memory as a software routine that, when executed by the processor, causes the apparatus to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the controller has one or more configurations to execute individual processes or sub-processes to perform embodiments of the methods. The controller can be connected to and configured to operate intermediate components to perform the functions of the methods. For example, the controller can be connected to and configured to control or receive data from one or more of gas valves, actuators, flow meters, pressure meters, etc.

The controller of some embodiments has one or more configurations selected from: a vacuum flow test configuration, a pressurized flow test configuration, or a vacuum rate-of-rise configuration, as described herein.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A showerhead assembly leak test fixture comprising:
- a fixture base having a top surface;
- a plurality of compression elements extending from the top surface of the fixture base;
- a seal plate having a top surface and a bottom surface with a plurality of protrusions extending from the top surface;
- a gasket having a top surface and a bottom surface, the bottom surface in contact with the plurality of protrusions extending from the seal plate; and
- a clamp configured to secure a showerhead assembly so that a front surface of a faceplate of the showerhead assembly contacts the gasket and each of the plurality of protrusions on the seal plate to block respective openings in the front surface of the faceplate.

2. The showerhead assembly leak test fixture of claim 1, wherein there are an equal number of protrusions extending from the seal plate as openings in the faceplate.

3. The showerhead assembly leak test fixture of claim 2, wherein each of the plurality of protrusions extending from the seal plate aligns with a corresponding opening in the faceplate.

4. The showerhead assembly leak test fixture of claim 3, wherein each of the plurality of protrusions has a flat top surface with a diameter greater than a diameter of the respective openings in the faceplate.

5. The showerhead assembly leak test fixture of claim 3, wherein each of the plurality of protrusions has a curved shape with a diameter smaller than a diameter of the respective openings in the faceplate.

6. The showerhead assembly leak test fixture of claim 5, wherein each of the plurality of protrusions comprises a curved body positioned within the respective openings in the seal plate, the curved bodies extending above the top surface of the seal plate.

7. The showerhead assembly leak test fixture of claim 5, wherein when a force is directed on the showerhead assembly in a direction of the fixture base, each of the plurality of protrusions push a portion of the gasket into the respective openings in the faceplate.

8. The showerhead assembly leak test fixture of claim 1, wherein each of the plurality of compression elements are positioned within respective openings in the top surface of the fixture base.

9. The showerhead assembly leak test fixture of claim 1, wherein each of the plurality of compression elements comprises springs.

10. The showerhead assembly leak test fixture of claim 1, further comprising a plurality of alignment pins extending from the top surface of the fixture base, the plurality of alignment pins configured to align with corresponding openings in the showerhead assembly so that the respective openings in the front surface of the faceplate align with each of the plurality of protrusions.

11. A method of testing a multi-channel showerhead assembly for leaks, the method comprising:
- sealing a plurality of openings in a front surface of a faceplate of the multi-channel showerhead assembly using a showerhead assembly leak test fixture, each of the plurality of openings in fluid communication with one channel of the multi-channel showerhead assembly, the showerhead assembly leak test fixture comprising a fixture base with a plurality of compression elements extending from a top surface thereof, a seal plate on the plurality of compression elements, the seal plate having a plurality of protrusions extending from a top surface thereof, and a gasket positioned on a top surface of the plurality of protrusions, the front surface of the faceplate of the multi-channel showerhead assembly in contact with the gasket;
- pressurizing one of the channels in the multi-channel showerhead assembly; and
- measuring gas leaking through another of the channels in the showerhead multi-channel assembly.

12. The method of claim 11, wherein sealing the plurality of openings comprises securing the multi-channel showerhead assembly to the gasket, seal plate and fixture base with a clamp directing force on the multi-channel showerhead assembly in a direction of the fixture base.

13. The method of claim 12, wherein securing the multi-channel showerhead assembly to the gasket, seal plate and fixture base causes the plurality of protrusions extending from the top surface of the seal plate to seal each of the respective openings in the faceplate of the multi-channel showerhead assembly.

14. The method of claim 13, wherein each of the plurality of protrusions has a flat top surface with a diameter greater than a diameter of the respective openings in the faceplate.

15. The method of claim 13, wherein each of the plurality of protrusions has a curved shape with a diameter smaller than a diameter of the respective openings in the faceplate.

16. The method of claim 15, wherein each of the plurality of protrusions is a curved body positioned within a respective opening in the seal plate, the curved bodies extending above the top surface of the seal plate.

17. The method of claim 15, wherein sealing the plurality of openings in the faceplate comprises pushing a portion of the gasket into the respective openings in the faceplate using the plurality of protrusions.

18. The method of claim 11, further comprising positioning the multi-channel showerhead assembly in the showerhead assembly leak test fixture by aligning a plurality of alignment pins extending from the top surface of the fixture base with corresponding openings in the multi-channel showerhead assembly.

19. A method of leak testing a dual channel showerhead assembly, the method comprising:

sealing a plurality of openings in the front surface of the showerhead assembly using the showerhead assembly leak test fixture of claim 1; and securing a test manifold to a back surface of the dual channel showerhead assembly having a first gas channel with a first inlet and a first outlet, and a second gas channel with a second inlet and a second outlet, the test manifold isolating the first gas channel from the second gas channel, the test manifold in fluid communication with the first inlet, the first outlet, the second inlet and the second outlet.

20. The method of claim 19, further comprising testing the dual channel showerhead assembly for leakage using one or more test configurations comprising:

(a) a vacuum flow test configuration in which a flow meter is connected to the first gas channel which is exposed to atmosphere, a vacuum connected to the second gas channel, and a flow rate in the first gas channel is measured;

(b) a pressurized flow test configuration in which a flow meter is connected to the first gas channel which is in fluid communication with a pressurized gas source, the second gas channel is exposed to atmosphere, and a flow rate in the first gas channel is measured; and (c) a vacuum rate-of-rise configuration in which the first gas channel is exposed to atmosphere, the second gas channel is isolated under vacuum, and a rate of rise in pressure in the second gas channel is measured.

* * * * *